(12) United States Patent
Liu et al.

(10) Patent No.: US 6,667,661 B1
(45) Date of Patent: Dec. 23, 2003

(54) LASER DIODE DRIVER WITH HIGH POWER EFFICIENCY

(75) Inventors: Cheh-Ming Jeff Liu, Thousand Oaks, CA (US); Neng-Haung Sheng, Thousand Oaks, CA (US)

(73) Assignee: Euvis, Inc., Westlake Village, CA (US)

( * ) Notice: Subject to any disclaimer, the term of this patent is extended or adjusted under 35 U.S.C. 154(b) by 82 days.

(21) Appl. No.: 10/125,996

(22) Filed: Apr. 19, 2002

Related U.S. Application Data

(60) Provisional application No. 60/288,752, filed on May 4, 2001.

(51) Int. Cl.[7] .............................. H03F 3/041; H03F 3/08
(52) U.S. Cl. ..................... 330/311; 330/302; 330/308
(58) Field of Search ............................... 330/311, 308, 330/302

(56) References Cited

U.S. PATENT DOCUMENTS

| | | | |
|---|---|---|---|
| 4,243,951 A | * | 1/1981 | Wolkstein et al. ............ 372/26 |
| 4,796,266 A | | 1/1989 | Banwell et al. |
| 5,091,797 A | | 2/1992 | Proebster |
| 5,371,755 A | * | 12/1994 | Murata et al. ........... 372/38.02 |
| 5,577,086 A | | 11/1996 | Fujimoto et al. |
| 5,578,944 A | * | 11/1996 | Sasaki ......................... 326/86 |
| 5,675,599 A | | 10/1997 | Abe et al. |
| 5,721,456 A | | 2/1998 | Kebukawa |
| 5,724,170 A | * | 3/1998 | Aizawa ...................... 398/197 |
| 5,761,230 A | | 6/1998 | Oono |
| 5,883,910 A | | 3/1999 | Link |
| 6,021,143 A | | 2/2000 | Ransijn et al. |
| 6,130,562 A | | 10/2000 | Bosch et al. |

OTHER PUBLICATIONS

Hans Ransijn, et al., "A 10–Gb/s Laser/Modulator Driver IC With a Dual–Mode Actively Matched Output Buffer," IEEE Journal of Solid–State Circuits, Sep. 2001, pp. 1314–1320, vol. 36, No. 9, IEEE, Piscataway, N.J.

* cited by examiner

*Primary Examiner*—Patricia Nguyen
(74) *Attorney, Agent, or Firm*—Michael Blaine Brooks, P.C.; Michael Blaine Brooks

(57) ABSTRACT

A laser diode driver circuit is disclosed that uses a cascode output stage having high-impedance load and a matching network for reducing mismatch interference. Due to the high-impedance load, on-chip dummy current is less than that required for laser diode drivers with matched loads. Accordingly, the number of transistors of said output stage can be reduced. Moreover, with an AC-coupled active load circuit replacing the matched resistance of the matching network, the power efficiency is improved. A laser diode driver circuit, in accordance with the present invention, can be applied to an optical transmitter with low power requirement.

7 Claims, 5 Drawing Sheets

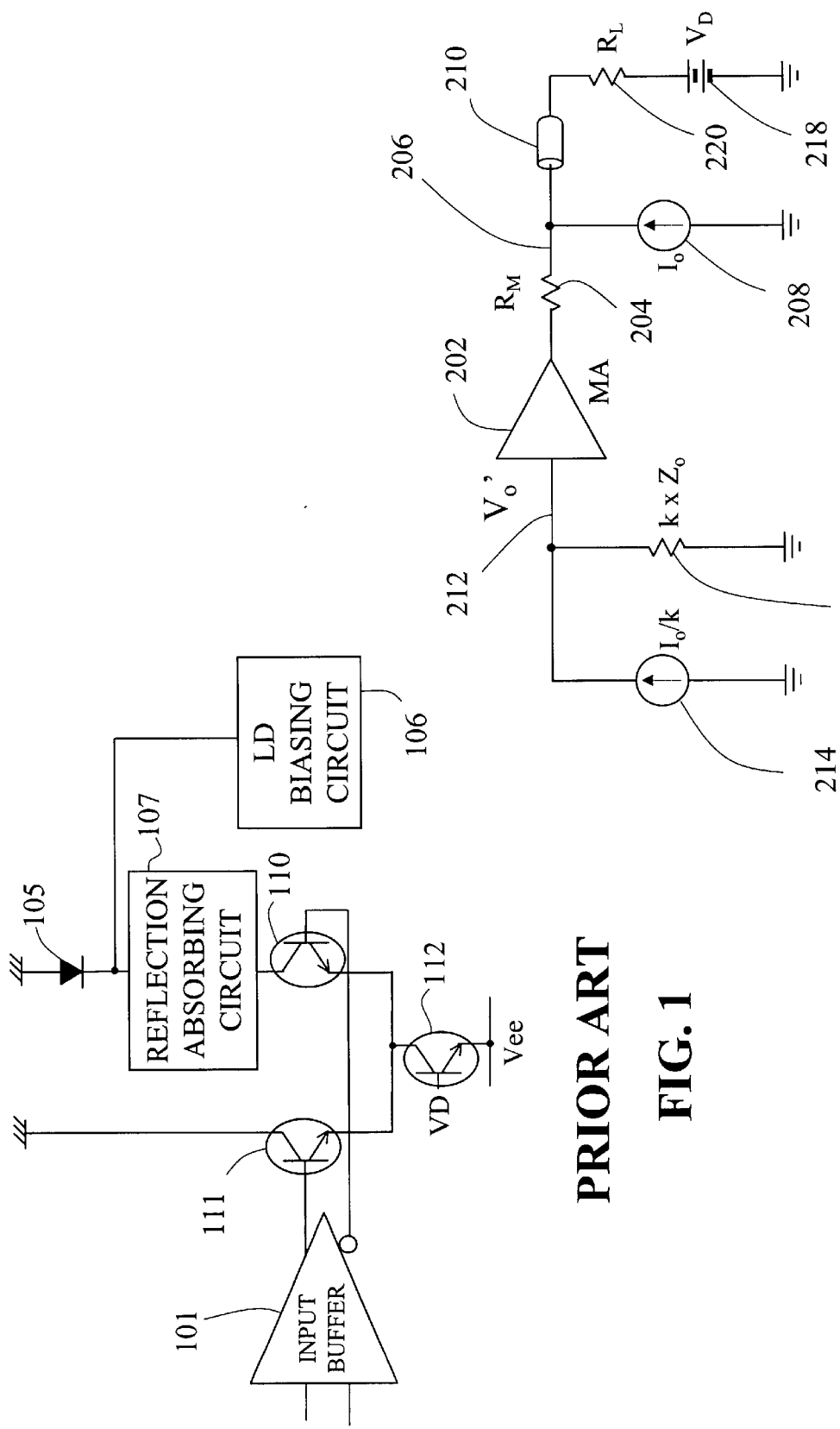

LASER DIODE DRIVER WITH HIGH POWER EFFICIENCY

CROSS REFERENCE TO RELATED APPLICATIONS

This application claims priority from the following U.S. provisional Patent Application, the disclosure of which is incorporated by reference in its entirety for all purposes: U.S. Provisional Patent Application Ser. No. 60/288,752, Cheh-Ming Jeff Liu and Neng-Haung Sheng entitled, "LASER DIODE DRIVER WITH HIGH POWER EFFICIENCY," filed May 4, 2001

BACKGROUND—FIELD OF THE INVENTION

The present invention relates to laser diode drivers and modulator drivers for fiber-optic communication applications and more particularly to laser diode drivers with output matching networks to improve power efficiency.

BACKGROUND—DESCRIPTION OF PRIOR ART

U.S. Pat. No. 5,721,456 to N. Kebukawa, assigned to Mitsubishi Denki Kabushiki Kaisha, discloses an optical transmitter in which a light-emitting device is driven by a differential circuit. FIG. 1 shows an optical transmitter with a reflection absorbing circuit 107 coupling between a common-emitter differential amplifier and a laser diode 105. The impedance of the differential amplifier is approximately that of an open circuit while the impedance at the laser diode end is that of a very low resistor, when the laser diode 107 is activated by the biasing circuit 106. There exists a significant mismatch at the interface resulting in considerable reflection. The reflection absorbing circuit 107 can absorb the reflection due to the mismatch between the high impendence differential amplifier and the low impedance laser diode 105. This approach provides a high efficiency means of delivering the modulation current to the laser diode 105.

However, in most modern laser diode modules, there is a matched termination as well as a RF choke for external biasing. Moreover, the integration of an optical transmitter is normally comprised of a laser diode module, a laser diode driver, which is in die format or in package format, and a matched transmission line at the interface. Therefore, with the typical configurations, there is no mismatch at the laser module or at the transmission line. Conventional laser diode drivers are designed with their output impedance matched to the transmission line and the laser diode module. Nevertheless, there is considerable power consumption associated with the matched load inside the laser diode driver. A laser diode driver with a high output impedance can increase the efficiency of delivering modulation current to the matched laser diode module at the expense of mismatch interference between the laser diode driver and the transmission line.

In the article "A 10-Gb/s Laser Diode/Modulator Driver IC With a Dual-Mode Actively Matched Output Buffer", IEEE Journal of Solid-State Circuits, vol. 36, No. 9, Sept. 2001, pp. 1314–1320, H. Ransijn, et al., disclose an active circuit that can be employed to reduce mismatching at the interface as demonstrated illustrated in FIG. 2. A unity-gain matching amplifier 202, MA, with an output impedance 204, $R_m$, is coupled between the output 206, $V_o$, with a modulation current 208, $I_o$, driving the load 210, $Z_o$, and a dependent source 212, $V_o'$, which is a combination of a fractional current source 214, $I_o/k$, and a multiple impedance 216, $kxZ_o$. Also shown in FIG. 2 is an offset 218, $V_D$, and a terminating impedance 220, $R_L$. Depending on the applications, the driver with this actively matched buffer can provide a DC-coupled back termination to optimize the matching condition at the interface between the output of the laser diode driver and laser diode module. Due to the matching amplifier 202, MA, the mismatch at the interface can be minimized without sacrificing the transmitting power. Therefore, the power efficiency of the output buffer is virtually twice that a conventional driver. However, because of the unknown external offset voltage of the laser diode, this approach requires a DC control loop to be robust to the variation in laser turn-on voltage. This DC control loop results in extra components and less output swing.

SUMMARY OF THE INVENTION

To achieve high-speed application, a differential amplifier with cascode configuration is utilized as an output stage of the laser diode driver. In order to reduce the power consumption, a high-impedance resistor is employed as a load for output transistors. The value of the load resistor is higher than the matched resistance of the laser diode module. The high-impedance transistor load ensures most of the modulated current from the transistors flows through the laser diode rather than through the load itself. Nevertheless, without additional circuitry, the mismatch of impedance can induce significant interference at the interface. Instead of a direct connection between the laser diode module and the transistor output, a matching network is employed. The matching network can be a combination of lumped elements, e.g., resistors and capacitors, as well as distributed elements, e.g., transmission lines. Because the mismatch interference is significant at high frequencies, the matching condition between the laser diode and the transistor output can be optimized to reduce high-frequency mismatch by introducing a capacitor in series with a resistor. The in-series resistor is selected to be close to matched resistance of the laser diode module. The matching network with a high DC load, a matched RF load in series with a capacitor, and distributed elements, can significantly reduce the mismatch interference between the high-impedance at the output of a cascode stage and the matched impedance at the laser diode module.

Furthermore, as opposed to Ransijn, et al., an AC-coupled active load is utilized to replace the RF matched resistor and thereby further increasing the power efficiency as compared to a passive matching network. The AC-coupled active matching network obviates the need for a DC control loop and can potentially increase the output swing experienced with the teachings of Ransijn, et al.

BRIEF DESCRIPTION OF THE DRAWINGS

For a more complete understanding of the present invention and for further features and advantages, reference is now made to the following description taken in conjunction with the accompanying drawings, in which:

FIG. 1 illustrates a prior art optical transmitter with a reflection absorbing circuit.

FIG. 2 illustrates a prior art DC-coupled active load circuit that can be employed to reduce interface mismatching.

DETAILED DESCRIPTION OF THE PREFERRED EMBODIMENT

Figure 3:
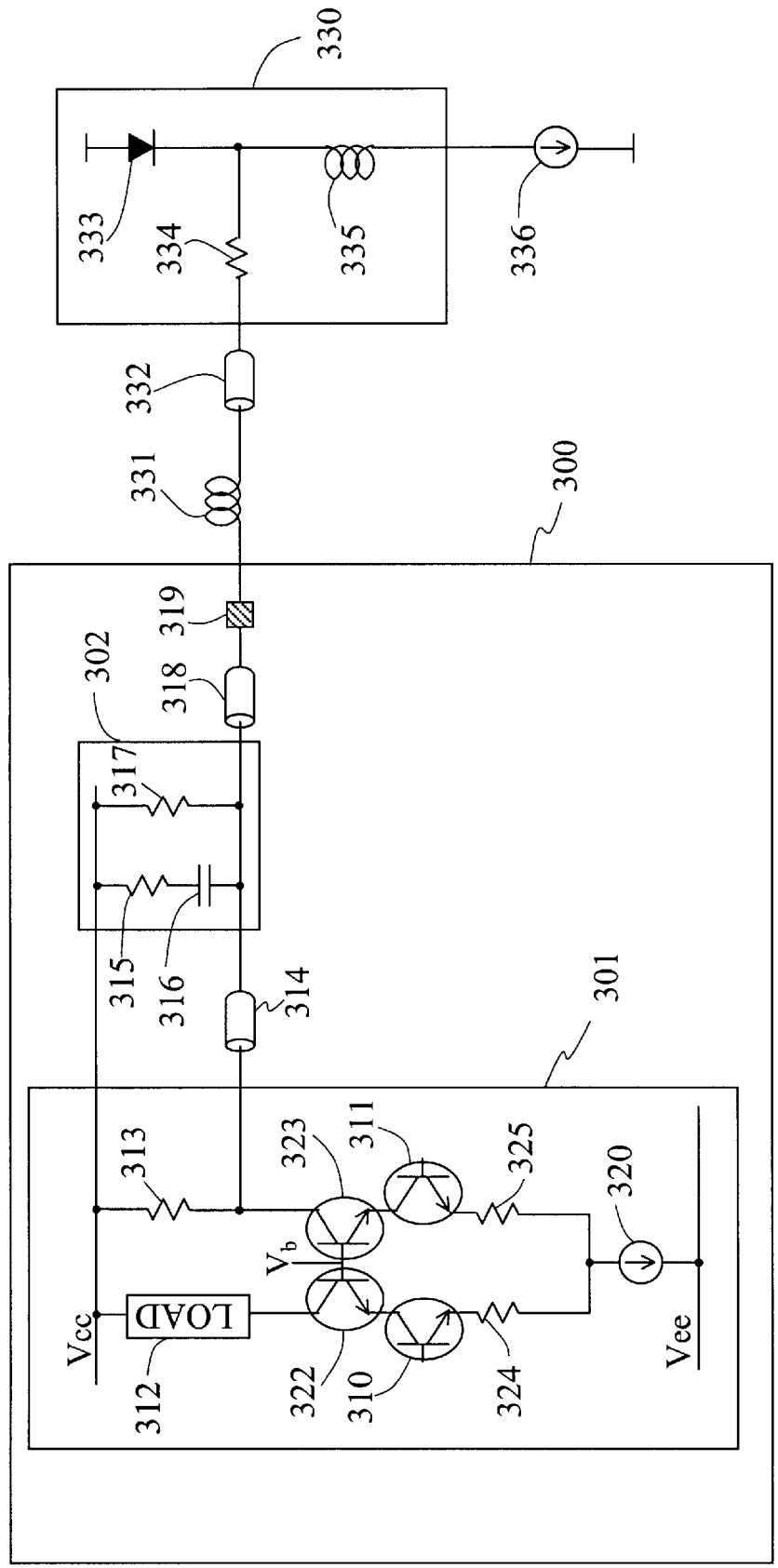
FIG. 3 is a circuit drawing illustrating the laser diode driver output stage of the preferred embodiment of the instant invention.

Referring to FIG. 3, the driver circuit 300, also termed a laser diode driver or LDD, is used to drive a laser diode module 330. A bond wire 331 connects the bond pad 319 and the transmission line 332. The laser diode 333 is connected to the opposite end of the transmission line 332 through a matching resistor 334. The laser diode 333 is biased by the bias circuit 336 through the RF choke 335. The matched resistance, $Z_o$, of the laser diode module 330 is a combination of the matching resistor 334 and the turn-on resistance of the laser diode 333.

Transistors 310 and 311 form a differential pair with emitter degeneration resistors 324 and 325 connected to a current generator 320. Common-base transistors 322 and 323, in conjunction with common-emitter transistors 310 and 311, form a cascode stage. A high-resistance resistor 313 and module 312 are the loads of the differential pair. A first transmission line 314 is the extension to a matching network 302, which is comprised of a second high-resistance resistor 317 in parallel with a resistor 315, the resistor 315 in parallel with the second high-resistance resistor 317 being in series with a capacitor 316. The second transmission line 318 is an extension between the matching network 302 and the bond pad 319.

Common-base transistors 322 and 323 increase amplifier bandwidth by reducing the increased capacitances of transistors 310 and 311 generated by the Miller effect. Moreover, due to the reduced capacitive coupling, the cascode stage offers a better isolation and improves the matching condition at high frequencies as opposed to a bare common-emitter differential amplifier as in FIG. 1. High-resistance resistors 313 and 317 operate to ensure most current passes through the matched-resistance laser diode module. High-resistance resistors 313 and 317 also provide the DC path in the absence of the laser diode 333.

The mismatch interference is determined by the matching condition between the high impedance transistor output and the matched impedance bond pad 319. The overall matching condition can be optimized by the matching network 302 functioning in association with the transmission lines 314 and 318. Thus, in a larger sense, the matching network can be considered as comprising the resistive and capacitive elements, as disclosed, as well as the transmission lines and/or other distributed elements. Since the mismatch interference occurs significantly only at high frequencies, it follows that matching condition optimization is better achieved at high frequencies. This optimization can be obtained by introducing an optimizing resistor 315 in series with a capacitor 314, both being in parallel with the second high-resistance resistor 317. The resistance value of resistor 315 is selected to be much smaller than the high-resistance resistors 313 and 317 and close to the matched resistance, $Z_o$, of laser diode module 330. The reciprocal of the time constant, that is the inverted multiplicative product of the optimizing resistor 315 and its in-series capacitor 316, yields the corner frequency 401, $\omega_c$ (FIG. 4A), above which the matching network 302 is approximately equivalent to the optimizing resistor 315.

Figure 4:
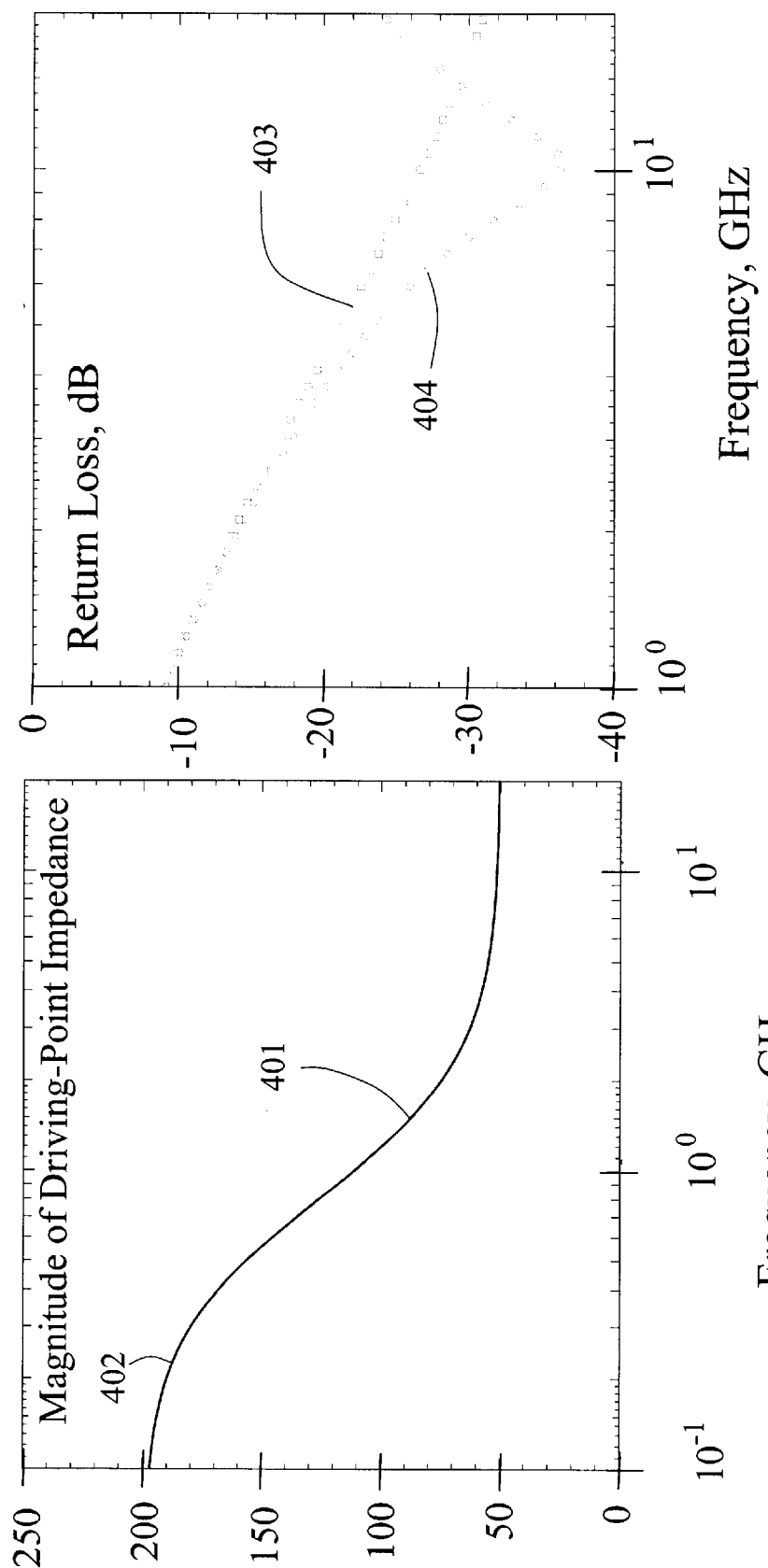
FIGS. 4A and 4B show respectively a frequency response of the driving-point impedance of the circuit driver and the return loss response sensitivity to transmission line effects.

FIG. 4A shows a frequency response of the driving-point impedance of the circuit driver 300. At frequencies lower than $\omega_z$ 402, the impedance of the matching network 302 is equivalent to a high-resistance resistor 313 that is in parallel with the second high-resistance resistor 317. In order to ensure most of the transistor current is delivered to the laser diode 333, the high-resistance resistors 313 and 317 are designed to be much larger in impedance than the matched resistance, $Z_o$, of the laser diode module 330. Mismatch interference is negligible at low frequencies. At frequencies higher than the cutoff frequency 401, $\omega_c$, the driving-point impedance of circuit driver 300 is approximately equivalent to the optimizing resistor 315, where the resistance of the resistor 315 is selected to be close to the matched resistance, $Z_o$, of the laser diode module 330 and thereby improve the matching condition at high frequencies.

The second transmission line 318 plays a role as an impedance transformer and is used to modify the impedance response of matching network 302 as shown in FIG. 4B. Without the second transmission line 318, the first return loss response 403 is higher than the return loss response 404 achieved with the use of the second transmission line 318 at the interesting frequencies.

Figure 5:
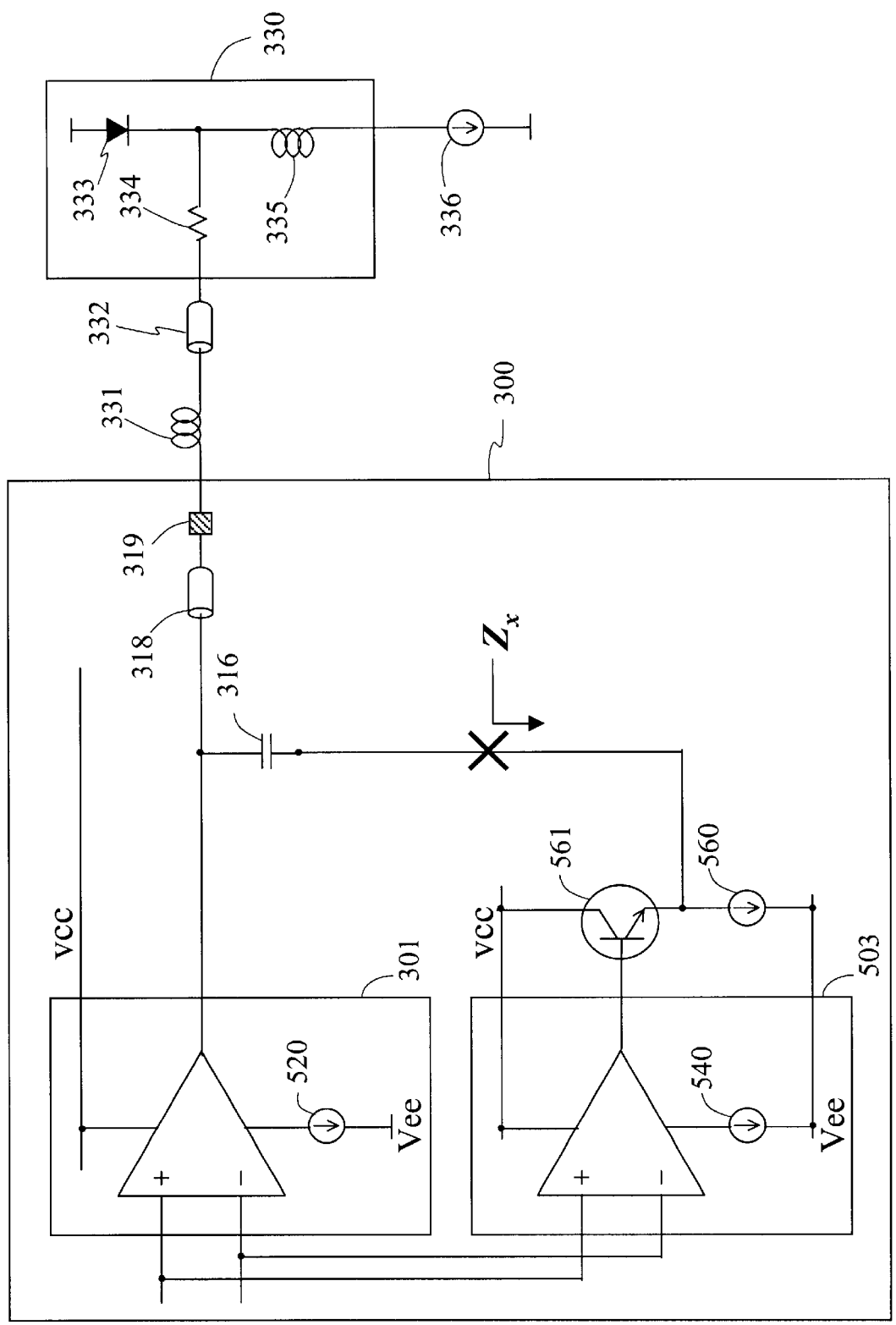
FIG. 5 is a circuit drawing illustrating the laser diode driver output stage of an alternative embodiment of the instant invention with an AC-coupled active load circuit.
Figure 6:
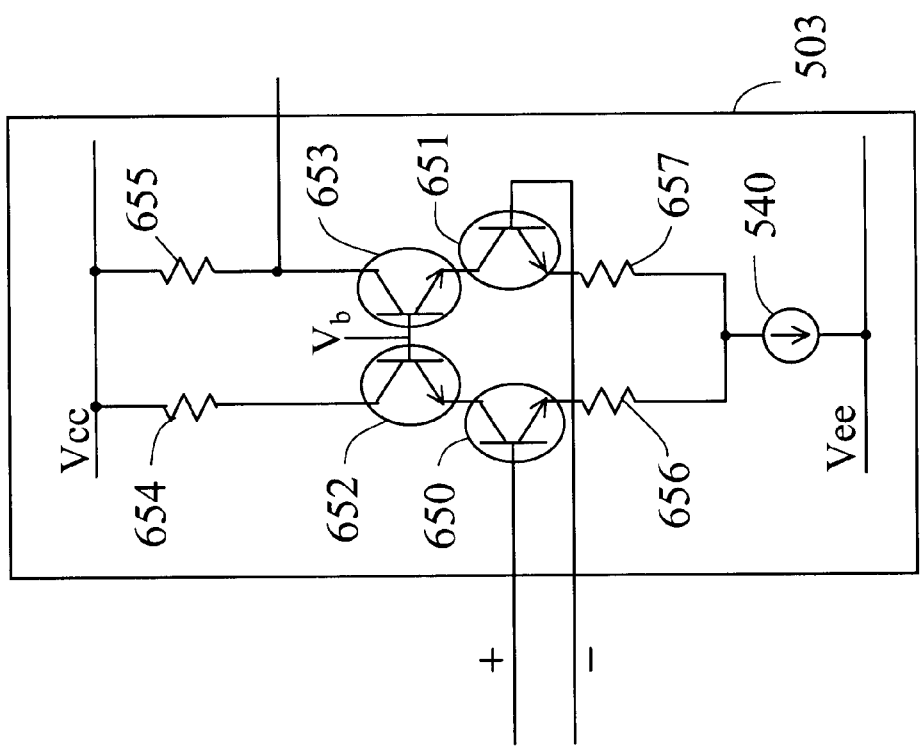
FIG. 6 is a circuit drawing providing further detail of the fractional amplifier of the alternative embodiment of the instant invention.

FIG. 5 illustrates an alternative embodiment of the invention. An active load circuit is used to replace the optimizing resistor 315. The active load circuit is comprised of a fractional amplifier 503 and an emitter-follower transistor 561 biased by a current source 560. The driving-point impedance, $Z_x$, of the active-load circuit can be adjusted by the bias current 560. FIG. 6 shows an alternative embodiment as a detailed circuit for the fractional amplifier 503. Fundamentally, in order to achieve high power efficiency, the bias current 540 of the fractional amplifier 503 is designed to be a fraction $1/k$ ($k>1$) of the bias current source 520. Referring to FIG. 6, resistors 654–657 are selected to make the fractional amplifier 503 have virtually the same gain response as the buffer circuit 301. The emitter follower transistor 561 acts as a unity-gain amplifier. By properly adjusting the bias current 560 and selecting the size of emitter follower transistor 561, the driving-point impedance $Z_x$ can be designed close to the matched resistance $Z_o$ of the laser diode module 330. Therefore, with the AC coupling capacitor 316, the active load circuit provides matching conditions at high frequencies. Finally, due to the AC coupling, the laser diode driver 300 does not require a DC control loop to compensate the turn-on voltage variation of the laser diode 333.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result.

In addition to the equivalents of the claimed elements, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

We claim:

1. A driver circuit comprising a cascade stage of high impedance and a matching network; said matching network comprising:

(a) a high load switchable to an open circuit;
   (b) a RF matched load in series with a capacitor; and
   (c) a plurality of distributed elements, whereby mismatch interference is reduced between the output of said cascode stage of high impedance and a laser diode module of matched impedance.

2. The driver circuit claimed in claim 1 wherein the high load switchable to an open circuit is comprised of a high-resistance resistor.

3. The driver circuit claimed in claim 1 wherein the RF matched load is comprised of an active load circuit.

4. The driver circuit claimed in claim 3 wherein the active load circuit is comprised of a fractional amplifier and an emitter-follower transistor biased by a current source.

5. The driver circuit claimed in claim 1 wherein the plurality of distributed elements comprise first and second transmission lines.

6. A driver circuit comprising a cascade stage of high impendence in electrical communication with a matching network; said matching network comprising:

(a) a high-resistance resistor switchable to an open circuit;
   (b) a RF matched load in series with a capacitor; the RF matched load and capacitor in parallel with the high-resistance resistor; and
   (c) a first transmission line for electrical communication with said cascode stage and a second transmission line for electrical communication with a laser diode module, whereby mismatch interference is reduced between the output of said cascode stage of high impedance and the laser diode module of matched impedance in electrical communication with said matching network.

7. A driver circuit comprising a cascade stage of high impendence in electrical communication with a matching network; said matching network comprising:

(a) a high-resistance resistor switchable to an open circuit;
   (b) a fractional amplifier and an emitter-follower transistor biased by a current source in series with a capacitor; the fractional amplifier, emitter-follower transistor and capacitor in parallel with the high-resistance resistor; and
   (c) a first transmission line for electrical communication with said cascade stage and a second
   transmission line for electrical communication with a laser diode module, whereby mismatch interference is reduced between the output of said cascode stage of high impedance and the laser diode module of matched impedance in electrical communication with said matching network.

* * * * *